(12) United States Patent
Lu et al.

(10) Patent No.: US 7,605,619 B1
(45) Date of Patent: Oct. 20, 2009

(54) I/O PROTECTION UNDER OVER-VOLTAGE AND BACK-DRIVE CONDITIONS BY SINGLE WELL CHARGING

(75) Inventors: Weiye Lu, Sunnyvale, CA (US); Elroy M. Lucero, San Jose, CA (US); Khusrow Kiani, Oakland, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/726,512

(22) Filed: Mar. 21, 2007

(51) Int. Cl.
*H03K 3/00* (2006.01)

(52) U.S. Cl. .................................. 327/108; 327/112

(58) Field of Classification Search ................ 327/108, 327/109, 110, 111, 112
See application file for complete search history.

(56) References Cited

U.S. PATENT DOCUMENTS 5,465,054 A * 11/1995 Erhart .......................... 326/34
5,537,059 A * 7/1996 Asahina ........................ 326/81
5,917,358 A * 6/1999 Sanchez et al. ............. 327/333
7,071,764 B1 * 7/2006 Kiani ........................... 327/437
7,135,914 B2 * 11/2006 Chih et al. ................... 327/543

* cited by examiner

*Primary Examiner*—Kenneth B. Wells
(74) *Attorney, Agent, or Firm*—Jurgen Vollrath

(57) ABSTRACT

In an I/O driver that includes a cascoded pair of PMOS driver transistors connected to a pair of cascaded NMOS driver transistors and that defines a pad output between the PMOS and NMOS driver transistors, a method of providing the CMOS I/O driver with over-voltage and back-drive protection includes providing circuitry for charging the wells of the PMOS transistors either to VDDIO during normal voltage mode by making use of the power supply, or to a common voltage during over-voltage and back-drive operation using the pad voltage.

12 Claims, 4 Drawing Sheets

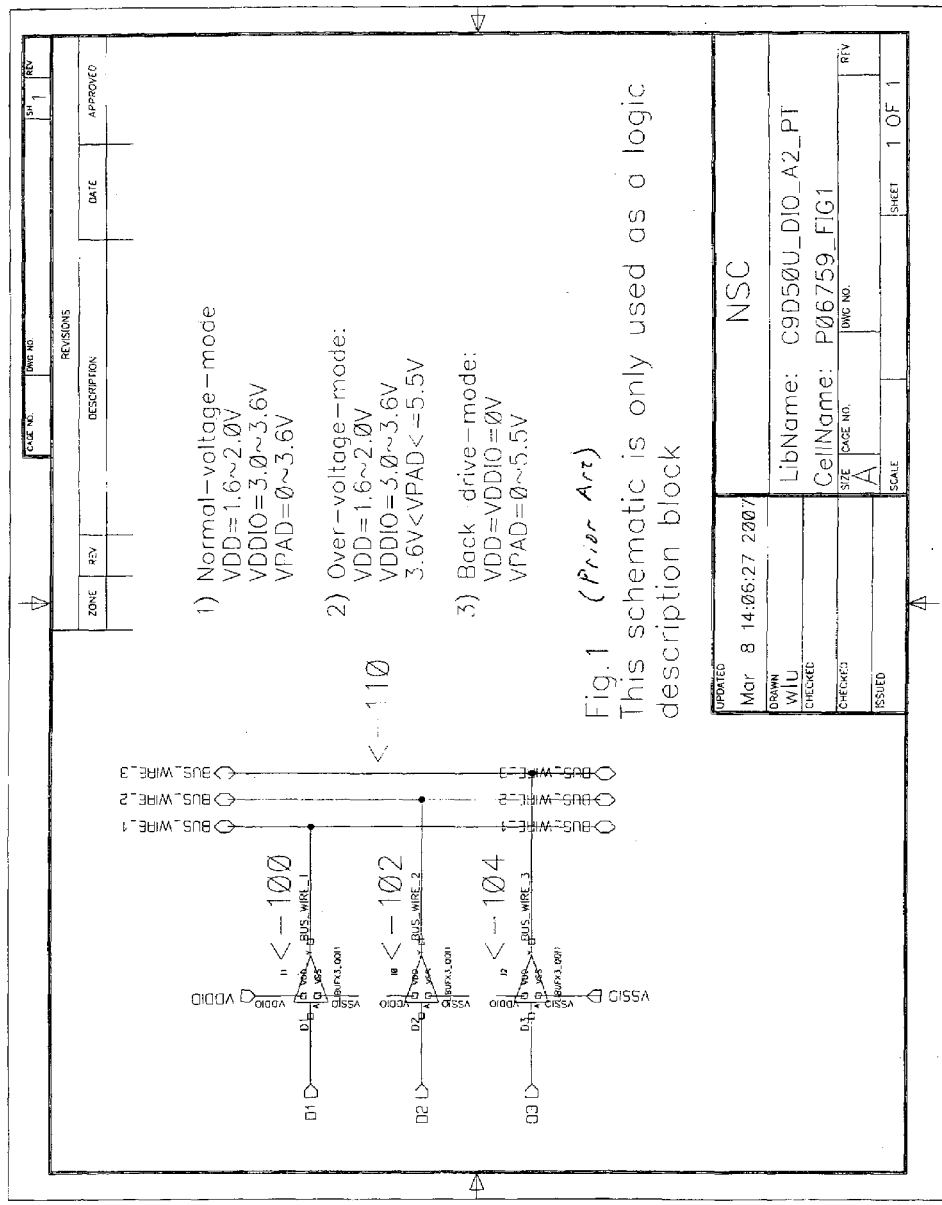

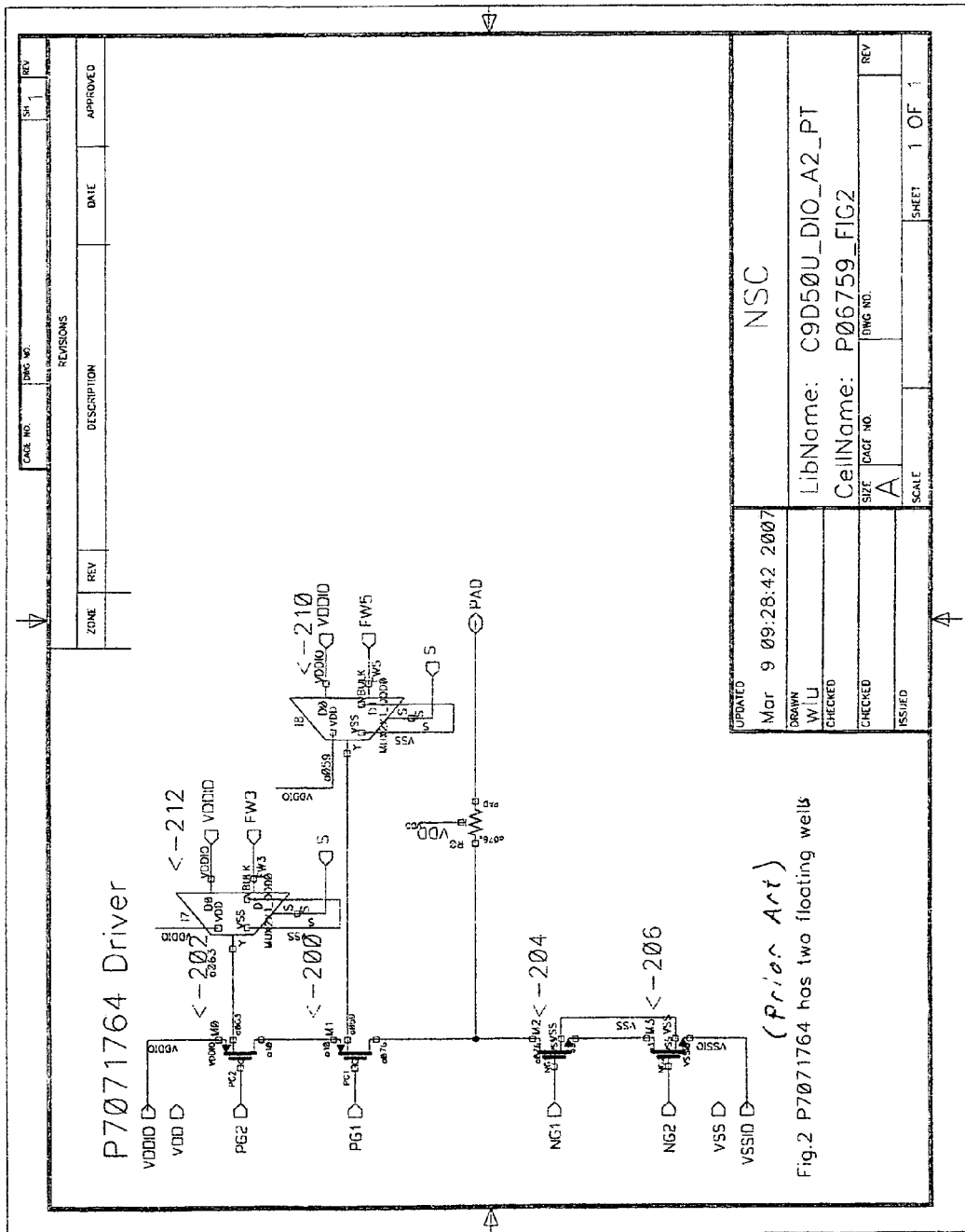

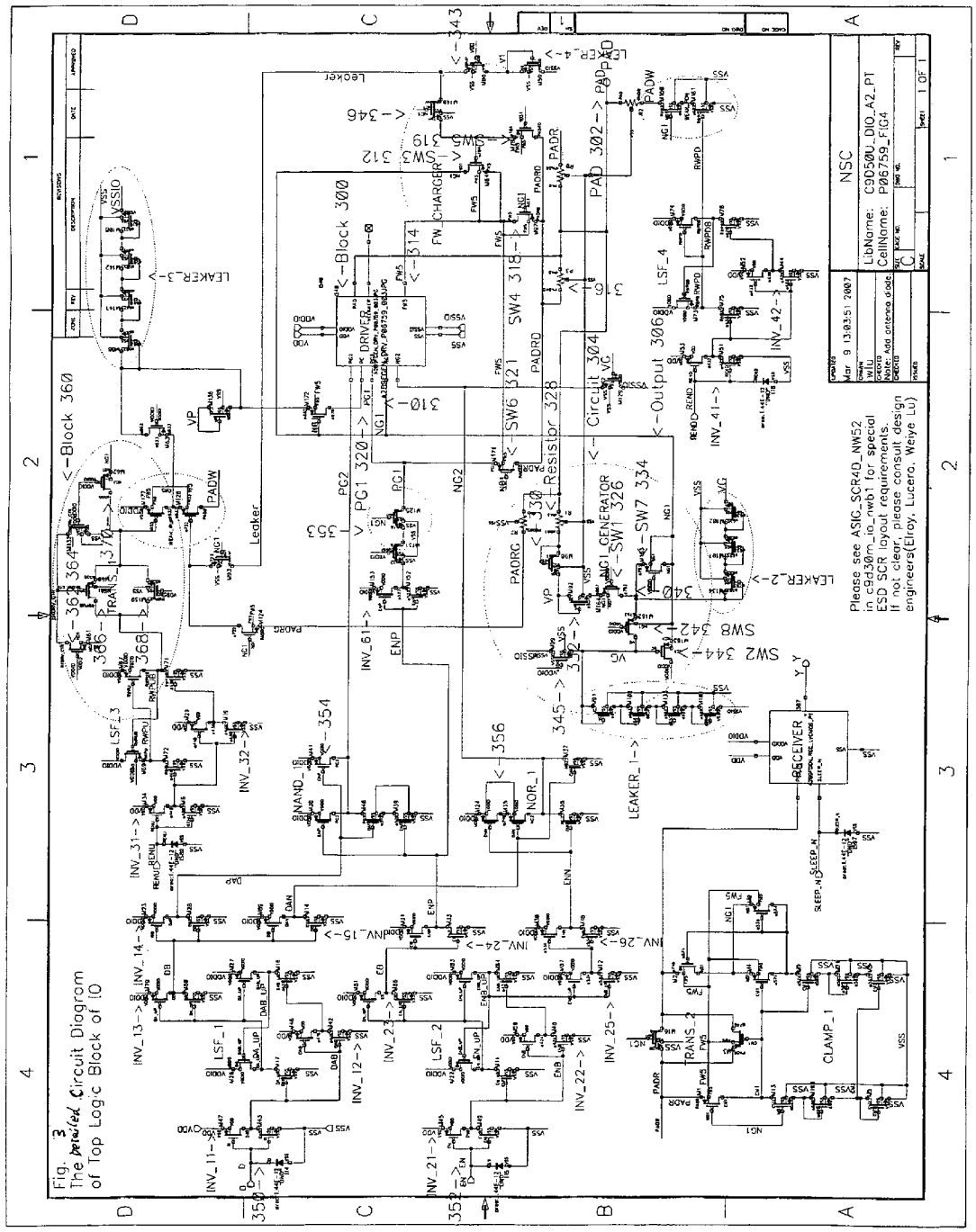
Fig. 3 The printed Circuit Diagram of Top Logic Block of IO

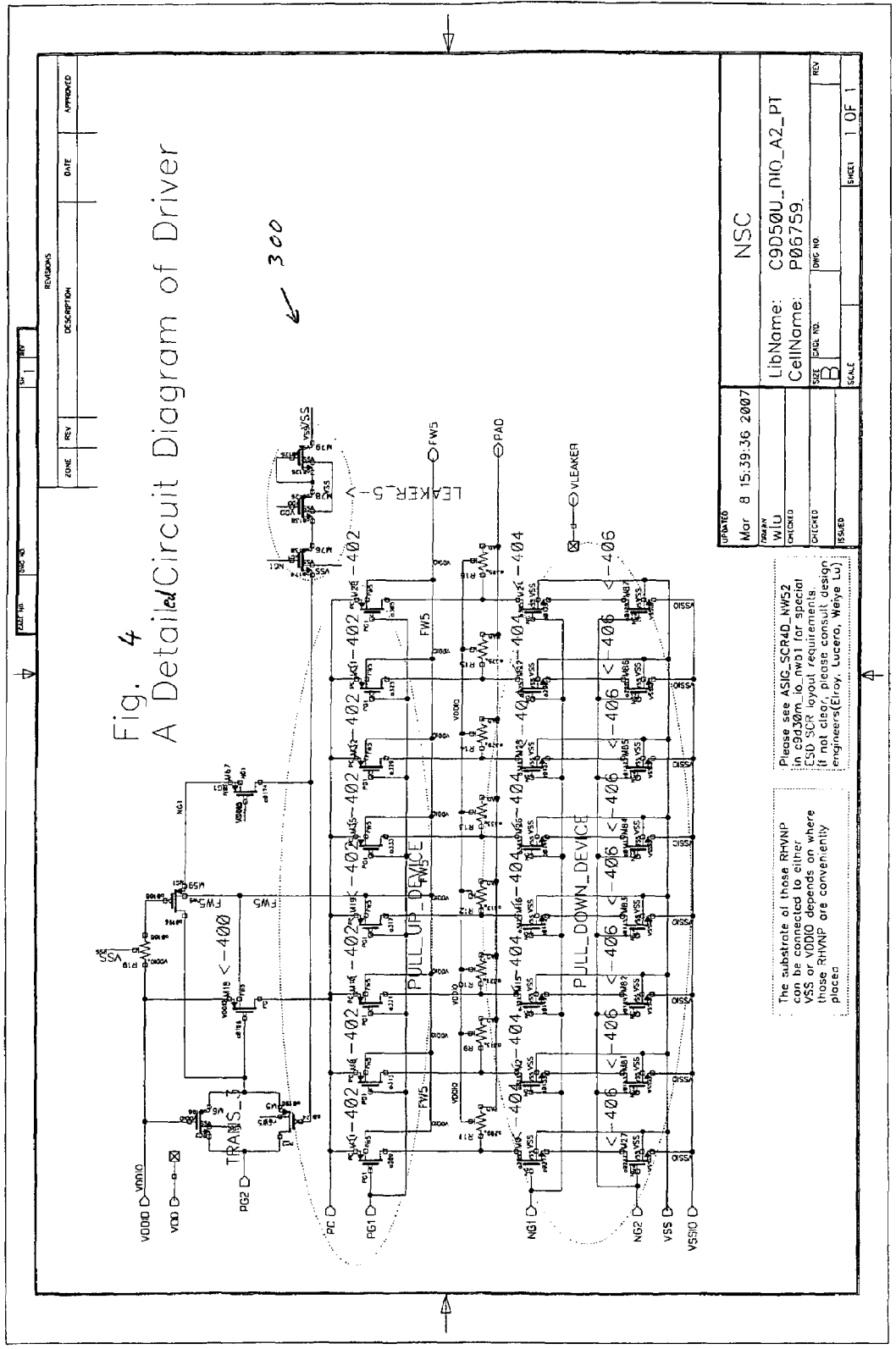

I/O PROTECTION UNDER OVER-VOLTAGE AND BACK-DRIVE CONDITIONS BY SINGLE WELL CHARGING

FIELD OF THE INVENTION

The invention relates to I/O drivers and the protection of I/O drivers during over-voltage and back-drive conditions.

BACKGROUND OF THE INVENTION

I/O drivers can be exposed to three modes of operation, including normal voltage mode, in which VDD is in the range of 1.6 to 2.0 V, VDDIO is 3.0 to 3.6 V, and the output from the I/O driver to the pad is at 0 to 3.6 V. The other two modes include over-voltage mode or operation in which a high voltage is fed into the pad from external circuitry while power is supplied to the driver, and back-drive mode or operation, which occurs during power up when VDD and VDDIO have not yet been applied to circuit. In particular, in over-voltage operation VDD is in the range of 1.6 to 2.0 V and VDDIO is 3.0 to 3.6 V, as in normal operation, however a voltage higher than VDDIO may be fed into the Pad (typically 3.6 to 5.5 V) by external circuitry. In back-drive operation VDD and VDDIO are both at 0V while a voltage of 0 to 5.5 V may be fed into the pad by external circuitry. This is best understood with respect to FIG. 1, which shows a simple driver circuit arrangement with multiple drivers 100, 102, 104 with their outputs connected to a bus 110 that connects to the pad.

In one prior art I/O driver described in commonly owned patent publication 7071764, the I/O driver is implemented as two PMOS transistors 200, 202 and two NMOS transistors 204, 206, as shown in simplified form in FIG. 2. The two PMOS transistors have different well voltage potentials FW3 and FW5 with respect to the pad output during normal mode. Also the gates of the PMOS and NMOS transistors are provided with different voltages, PG1, PG2, NG1, NG2. In order to avoid gate oxide breakdown or well junction breakdown during over-voltage and back-drive operation, the wells of the PMOS transistors and the gates of the PMOS and NMOS transistors are charged to different voltage levels by making use of charging circuits that are fed through a multiplexer arrangement that is depicted in simplified form by reference numerals 212 and 210.

It will be appreciated that the charging circuitry for charging the wells and gates adds an extra level of complexity and requires a substantial amount of space. The present invention seeks to provide a solution that requires a charging circuit that is less complex and less space consuming.

SUMMARY OF THE INVENTION

The invention proposes a method of providing a CMOS I/O driver with over-voltage and back-drive protection, the I/O driver including a cascoded pair of PMOS driver transistors connected to a pair of cascoded NMOS driver transistors and defining a pad output between the pair of PMOS and NMOS driver transistors, the method including circuitry for charging the wells of the PMOS transistors to a common voltage during over-voltage and back-drive operation. The method may also include providing circuitry for charging the gate of at least one of the PMOS driver transistors (PG1) and the gate of at least one of the NMOS driver transistors (NG1) during overvoltage and back-drive operation.

The method may include defining a first NMOS gate voltage (NG1) during back-drive operation by providing a pad input and one or more voltage drops to define NG1, and providing a first switch (SW1) that is operable to close when NG1 exceeds VDDIO by a predefined amount. The first switch may include one or more PMOS transistors controlled by VDDIO. As is discussed in greater detail below, the method may include using NG1 not only to charge the gate of one of the NMOS driver transistors but also to charge the wells of the PMOS driver transistors during normal mode of operation.

During normal voltage mode or operation NG1 may be defined by VDDIO that is fed through a second switch (SW2) controlled to switch on when VDDIO is present. It will therefore be appreciated that NG1 will be defined either by VDDIO when VDDIO is presented (Normal voltage mode) or by the pad voltage when Vpad is greater than 3.6V but less than 5.5V (reduced by proper voltage drops e.g. one or more diode-connected NMOS voltage drops) (Back-drive mode of operation and over-voltage mode of operation).

The PMOS transistor of the second switch may be controlled to conduct when VDDIO is present (normal and over-voltage mode of operation) by having the gate of said PMOS transistor connected to a VDDIO controlled NMOS that connects to VSSIO.

As discussed above, the wells of the PMOS driver transistors are typically also charged. During normal mode of operation the PMOS driver transistor wells (FW5) are typically charged using NG1 fed through a third PMOS switch (SW3) that is controlled to be on during normal mode of operation but off during back-drive and over-voltage operation.

During over-voltage operation, the wells of the PMOS driver transistors may be charged using the pad voltage reduced by a defined amount and fed into the PMOS driver transistor wells via a fourth PMOS switch controlled by NG1, while a fifth PMOS switch, also controlled by NG1 is used to switch off the third PMOS switch.

During back-drive operation the pad voltage fed through the fifth switch is again used to charge the gate of the third switch causing the third switch to turn off as in over-voltage operation, however the NG1 voltage controlling the third and fifth switches is derived from the pad via the first switch as discussed above.

During back-drive and over-voltage operation, typically the gate of at least one of the PMOS driver transistors, preferably the first PMOS driver transistor connected to the second NMOS driver transistor is charged. To charge said at least one PMOS driver transistor gate, the method may provide an NG1 controlled sixth PMOS switch that connects the pad output to said driver gate by connecting the pad to said PMOS driver transistor gate when the NG1 voltage is appropriate a few-diode drops lower than the PAD voltage (during back-drive and over-voltage operation).

BRIEF DESCRIPTION OF THE DRAWINGS

FIG. 1 is a simple circuit diagram of an I/O driver arrangement as known in the art, FIG. 2 is a prior art driver logic circuit diagram, FIG. 3 is a detailed driver circuit diagram of one embodiment of an I/O driver with over-voltage and back-drive protection, and FIG. 4 is a more detailed circuit diagram of the top block of the I/O driver in FIG. 3.

DETAILED DESCRIPTION OF THE INVENTION

In order to provide an I/O CMOS driver capable of handling VDDIO of 5.5 V the applicant has developed a one-charging-floating-well-protection-circuit that includes a pair of PMOS transistors (referred to herein as PMOS driver transistors to distinguish them from other PMOS transistors forming part of the circuit) connected to a pair of NMOS transistors (referred to herein as NMOS driver transistors to distinguish them from other NMOS transistors forming part of the circuit). In one embodiment, as shown in FIG. 4 the pair of PMOS driver transistors includes an upper (or second) PMOS driver transistor 400 with its source connected to VDDIO, and its drain connected to a bank of lower (or first) PMOS driver transistors 402. The pair of NMOS driver transistors also includes a first NMOS driver in the form of a bank of NMOS driver transistors 404 and a second NMOS driver transistor in the form of bank of NMOS driver transistors 406. Since the banks of transistors serve merely to accommodate the power requirements, the driver transistors will simply be referred to as first PMOS driver transistor 402, second PMOS driver transistor 400, first NMOS driver transistor 404, and second NMOS driver transistor 406.

One embodiment of the invention is shown in FIG. 3, in which the I/O CMOS driver circuit of FIG. 4 is depicted by the block 300. In accordance with the invention, in order to avoid the driver transistors being damaged by well-junction breakdown during normal, over-voltage and back-drive operation, the wells of the PMOS driver transistors 400, 402 are charged to substantially the drain voltage. Also, to avoid gate oxide breakdown the gates of the first NMOS and PMOS driver transistors 402, 404 are charged during normal, over-voltage and back-drive operation to substantially the drain voltage.

This is done in the present embodiment by defining a voltage NG1 derived during back-drive operation from the pad voltage obtained from pad contact 302 and defined by means of the circuitry indicated generally by reference numeral 304. The output from this circuit 304 is used to charge the gate of the first NMOS driver transistor 204 in FIG. 2, as indicated by the input (NG1) 310 to block 300 in FIG. 3.

To better understand the generation of the voltage NG1 during back-drive and over-voltage operation, the circuit 304 will be considered in greater detail. The circuit 304 comprises a first PMOS switch 326 controlled by VDDIO and fed from the Pad 302 via a resistor 328 and two diode connected transistors 330, 332. The first PMOS switch 326 drain output passes through another VDDIO controlled PMOS switch 334 to define the voltage NG1 at output 306 based on the pad voltage. In particular, when the voltage at the input (source) of the PMOS switch 326 exceeds VDDIO (i.e., during back-drive operation) PMOS 326 and PMOS 334 turn on to define NG1 as Vpad minus (voltage drop across the resistor 328 and the diodes 330, 332). During back-drive operation the node 340 will therefore also be greater than VDDIO (since VDDIO is zero during back-drive mode), thereby switching on transistor 342. The resultant high voltage on the gate of PMOS 344, switches off PMOS 344.

During normal mode of operation, when VDDIO is present, PMOS 344 turns on since its gate is connected to VSSIO through VDDIO controlled NMOS 345. At the same time first PMOS switch 326 and PMOS 334 turn off since their gates are controlled by VDDIO. Thus, during normal operation NG1 is defined by VDDIO. The NMOS driver transistor gate is therefore charged to VDDIO (input 310) during normal voltage mode.

As shown in FIG. 3, the NG1 voltage provided at the output 306 of the circuitry 304 is also fed into the FW5 input 314 of the block 300. This charges the wells of the PMOS driver transistors 400, 402 (as shown in FIG. 4) during normal operation since NG1 passes through a third PMOS switch (SW3) 312 which turns on during normal mode as is discussed below.

During normal operation NG1 is at VDDIO, thereby switching off NG1 controlled fourth PMOS transistor switch (SW4) 318 and fifth PMOS switch (SW5) 319. On the other hand, NMOS 343 (controlled by VDD) and NMOS 346 (controlled by NG1) both turn on, thereby pulling the gate to the third PMOS switch 312 low and turning it on to allow the wells of the PMOS driver transistors to be charged to NG1.

During over-voltage operation well inputs (FW5) 314 are charged using the pad voltage from pad 304 reduced by the voltage drop over a two-diode-connected NMOS and a resistor 316 and fed into the PMOS driver transistor wells via the fourth PMOS switch (SW4) 318 controlled by NG1 and indicated by reference numeral 318. Since the fifth PMOS switch 319 also turns on, it pulls the gate of the third PMOS switch 312 high, switching it off.

During back-drive operation with $NG1=Vpad-(2Vtn+Vr)$ and $VDDIO=0$ (where Vtn is the voltage drop over each of the diodes 330, 332, and Vr is the voltage drop over the resistor 328) fourth and fifth PMOS switches 318, 319 again turn on to turn off third PMOS switch 312 and charge FW5 from the pad voltage.

The gate of the first PMOS driver transistor 402 is also charged during normal, back-drive and over-voltage operation. In particular, during back-drive and over-voltage operation the voltage from pad 302 passes through the resistor 316 and a sixth PMOS switch (SW6) 321 to provide the PMOS gate charging input (PG1) 320. The sixth PMOS switch 321 is controlled by NG1 and therefore turns on during over-voltage and back-drive operation. On the other hand, during normal operation, when NG1=VDDIO and the pad voltage is equal or less than VDDIO, the sixth PMOS switch 321 turns off and the PG1 input 320 is derived from the enable input 352 via NG1 controlled NMOS switch 353.

As shown in FIG. 3, the gate of the second PMOS driver transistor PG2 is not charged by a charging circuit but receives its input from the data input 350 and enable input 352 via NAND gate 354. The gate of the second NMOS driver transistor in turn receives its input from the data input 350 and enable input 352 via NOR gate 356.

By making use of a single well (FW5) charging voltage method, the present invention saves layout space, reduces the complication of the over-voltage and back-drive protection circuit, and reduces the possibility of leakage while still ensuring that there is no well breakdown during back-drive and over-voltage mode of operation.

While the present invention has been described with respect to a particular embodiment, it is not so limited and includes other embodiments as defined by the claims.

What is claimed is:

1. A method of providing a CMOS I/O driver with over-voltage and back-drive protection, the I/O driver including a cascoded pair of PMOS driver transistors connected to a pair of cascoded NMOS driver transistors and defining a pad output between the PMOS and NMOS driver transistors, the method including
    providing circuitry for charging the wells of the PMOS transistors to a common voltage during over-voltage and back-drive operation, and
    defining a first NMOS gate voltage (NG1) during back-drive operation by providing a pad input and one or more voltage drops to define NG1, and providing a first switch (SW1) that is operable to close when NG1 exceeds VDDIO by a predefined amount.

2. The method of claim 1, further including providing circuitry for charging the gate of at least one of the PMOS driver transistors and the gate of at least one of the NMOS driver transistors during over-voltage and back-drive operation.

3. The method of claim 1, wherein the first switch includes one or more PMOS transistors controlled by VDDIO.

4. The method of claim 1, wherein NG1 is used not only to charge the gate of at least one of the NMOS driver transistors but also to charge the wells of the PMOS driver transistors during normal mode of operation.

5. The method of claim 4, wherein during normal voltage mode of operation NG1 is defined by VDDIO that is fed through a second switch (SW2) controlled to switch on when VDDIO is present.

6. The method of claim 5, wherein the second switch is defined by a PMOS transistor that is controlled to conduct during normal mode of operation by having the gate of said PMOS transistor of the second switch connected to a VDDIO controlled NMOS that connects to VSSIO.

7. The method of claim 6, wherein during normal mode of operation the PMOS driver transistor wells (FW5) are charged using NG1 fed through a third switch (SW3) defined by a PMOS transistor that is controlled to be on during normal mode of operation but off during back-drive and over-voltage operation.

8. The method of claim 7, wherein during over-voltage operation, the wells of the PMOS driver transistors are charged using the pad voltage reduced by a defined amount and fed into the PMOS driver transistor wells via a fourth switch defined by a PMOS transistor controlled by NG1, while a fifth switch defined by a PMOS transistor, also controlled by NG1 is used to switch off the third switch.

9. The method of claim 7, wherein during back-drive mode of operation the pad voltage fed through the fifth switch is again used to charge the gate of the third switch causing the third switch to turn off as in over-voltage operation, however the NG1 voltage controlling the third and fifth switches is derived from the pad via the first switch.

10. The method of claim 9, wherein during back-drive and over-voltage operation, the gate of at least one of the PMOS driver transistors is charged.

11. The method of claim 10, wherein the PMOS driver transistor that is charged is, the first PMOS driver transistor connected to the second NMOS driver transistor.

12. The method of claim 10, wherein to charge said at least one gate of the PMOS driver transistor during back-drive and over-voltage operation, the method provides an NG1 controlled sixth switch defined by a PMOS transistor that connects the pad output to said gate of the PMOS driver transistor when the NG1 voltage is at a predefined level below the PAD voltage.

* * * * *